(12) United States Patent
Ka et al.

(10) Patent No.: US 10,283,578 B2
(45) Date of Patent: May 7, 2019

(54) ORGANIC LIGHT EMITTING DIODE DISPLAY DEVICE

(71) Applicant: SAMSUNG DISPLAY CO., LTD., Yongin-si, Gyeonggi-do (KR)

(72) Inventors: Jihyun Ka, Asan-si (KR); Wonkyu Kwak, Seongnam-si (KR); Hansung Bae, Seongnam-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 50 days.

(21) Appl. No.: 15/693,908

(22) Filed: Sep. 1, 2017

(65) Prior Publication Data
US 2018/0069068 A1 Mar. 8, 2018

(30) Foreign Application Priority Data

Sep. 7, 2016 (KR) .................. 10-2016-0115055

(51) Int. Cl.
| | |
|---|---|
| *H01L 27/32* | (2006.01) |
| *H01L 31/112* | (2006.01) |
| *H01L 51/52* | (2006.01) |
| *G06K 9/00* | (2006.01) |

(Continued)

(52) U.S. Cl.
CPC ...... *H01L 27/3262* (2013.01); *G06K 9/00013* (2013.01); *G09G 3/3233* (2013.01); *H01L 27/1222* (2013.01); *H01L 27/3227* (2013.01); *H01L 27/3246* (2013.01); *H01L 27/3258* (2013.01); *H01L 27/3272* (2013.01); *H01L 27/3276* (2013.01); *H01L 31/1129* (2013.01);
(Continued)

(58) Field of Classification Search
CPC ............ H01L 27/3276; H01L 27/3262; H01L 27/3227; H01L 31/1136; H01L 51/50
See application file for complete search history.

(56) References Cited

U.S. PATENT DOCUMENTS

| | | |
|---|---|---|
| 6,191,764 B1 | 2/2001 | Kono et al. |
| 9,257,495 B2 | 2/2016 | Choi |

(Continued)

FOREIGN PATENT DOCUMENTS

| | | |
|---|---|---|
| EP | 1 617 399 A2 | 1/2006 |
| KR | 2011-0039773 A | 4/2011 |

(Continued)

OTHER PUBLICATIONS

Lee, et al., "Light Effects of the Amorphous Indium Gallium Zinc Oxide Thin-Film Transistor", Journal of Information Display, vol. 10, No. 4, Dec. 2009 (ISSN 1598-0316).

(Continued)

*Primary Examiner* — Joseph C. Nicely
(74) *Attorney, Agent, or Firm* — Lee & Morse, P.C.

(57) ABSTRACT

An organic light emitting diode display device includes a substrate, a plurality of organic light emitting diodes on the substrate, a thin film encapsulation layer on the organic light emitting diodes, and at least one sensor on the thin film encapsulation layer, the sensor including a sensing gate electrode, an oxide semiconductor layer overlapping the sensing gate electrode, a sensing source electrode connected to the oxide semiconductor layer, and a sensing drain electrode spaced apart from the sensing source electrode and connected to the oxide semiconductor layer.

20 Claims, 11 Drawing Sheets

(51) Int. Cl.
*H01L 51/50* (2006.01)
*H01L 27/12* (2006.01)
*H01L 31/113* (2006.01)
*G09G 3/3233* (2016.01)
*H02S 40/44* (2014.01)

(52) U.S. Cl.
CPC .......... *H01L 31/1136* (2013.01); *H01L 51/50* (2013.01); *H01L 51/5253* (2013.01); *H02S 40/44* (2014.12); *G09G 2310/0251* (2013.01); *G09G 2310/0262* (2013.01); *G09G 2354/00* (2013.01); *H01L 27/1225* (2013.01); *H01L 2251/303* (2013.01)

(56) References Cited

U.S. PATENT DOCUMENTS

| | | |
|---|---|---|
| 2005/0200293 A1 | 9/2005 | Naugler, Jr. et al. |
| 2006/0012311 A1* | 1/2006 | Ogawa ................. G09G 3/3233 315/169.3 |
| 2010/0007632 A1 | 1/2010 | Yamazaki |
| 2011/0084955 A1 | 4/2011 | Kim |
| 2013/0308073 A1 | 11/2013 | Yamazaki et al. |
| 2016/0266721 A1 | 9/2016 | Kurokawa et al. |

FOREIGN PATENT DOCUMENTS

| | | |
|---|---|---|
| KR | 2011-0051610 A | 5/2011 |
| KR | 2012-0115248 A | 10/2012 |
| KR | 2015-0126503 A | 11/2015 |

OTHER PUBLICATIONS

European Search Report dated Feb. 5, 2018 of the corresponding European Application No. 17 189 724.2.

\* cited by examiner

ORGANIC LIGHT EMITTING DIODE DISPLAY DEVICE

CROSS-REFERENCE TO RELATED APPLICATION

Korean Patent Application No. 10-2016-0115055, filed on Sep. 7, 2016, in the Korean Intellectual Property Office, and entitled: "Organic Light Emitting Diode Display Device," is incorporated by reference herein in its entirety.

BACKGROUND

1. Field

Embodiments relate to an organic light emitting diode ("OLED") display device.

2. Description of the Related Art

An organic light emitting diode ("OLED") display device is a self-luminous display device that displays an image using an OLED emitting light. An OLED display device does not require a separate light source and thus may have a relatively small thickness and weight. Further, OLED display devices are garnering attention as next generation display devices for portable electronic devices because they have high quality characteristics such as low power consumption, high luminance, and high reaction speed.

The above information disclosed in this Background section is only for enhancement of understanding of the background of the inventive concept, and, therefore, it may contain information that does not form the prior art that is already known in this country to a person of ordinary skill in the art.

SUMMARY

Embodiments are directed to an organic light emitting diode display device, including a substrate, a plurality of organic light emitting diodes on the substrate, a thin film encapsulation layer on the organic light emitting diodes, and at least one sensor on the thin film encapsulation layer, the sensor including a sensing gate electrode, an oxide semiconductor layer overlapping the sensing gate electrode, a sensing source electrode connected to the oxide semiconductor layer, and a sensing drain electrode spaced apart from the sensing source electrode and connected to the oxide semiconductor layer.

The sensor may be between adjacent organic light emitting diodes.

The organic light emitting diode may include a first electrode, an organic light emitting layer on the first electrode, and a second electrode on the organic light emitting layer. The sensing gate electrode may be spaced apart from the first electrode in a lateral direction.

The organic light emitting diode display device may further include a pixel defining layer between the first electrodes, the sensor vertically overlapping the pixel defining layer.

The oxide semiconductor layer may include at least one of: zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The oxide semiconductor layer may have photoreactivity.
The oxide semiconductor layer may absorb a visible light.

The visible light may change an electric charge mobility of the oxide semiconductor layer.

The oxide semiconductor layer may have an electric charge mobility varying according to a wavelength of the visible light.

The oxide semiconductor layer may have thermal sensitivity.

The oxide semiconductor layer may absorb infrared light, and the infrared light may change an electric charge mobility of the oxide semiconductor layer.

The organic light emitting diode may be connected to a thin film transistor, the thin film transistor may be connected to a gate line on the substrate and a data line on the substrate, the data line intersecting the gate line, the sensing gate electrode may be connected to a reset line parallel to one of the gate line and the data line, and the sensing source electrode may be connected to a sensor power line parallel to another of the gate line and the data line.

The sensing drain electrode may be connected to an output line parallel to one of the gate line and the data line.

The organic light emitting diode display device may further include a light blocking layer between the thin film encapsulation layer and the sensor.

The organic light emitting diode display device may further include a color filter on the sensor.

The sensor may be a fingerprint recognition sensor.

The thin film encapsulation layer may include a laminate of inorganic and organic layers, the inorganic and organic layers being interposed between the oxide semiconductor layer and an upper electrode of the organic light emitting diode.

Embodiments are also directed to an organic light emitting diode device, including a substrate, a plurality of organic light emitting diodes on the substrate, a thin film encapsulation layer on the organic light emitting diodes, and a fingerprint recognition sensor on the thin film encapsulation layer, the fingerprint recognition sensor including at least one sensor that includes a sensing gate electrode, an oxide semiconductor layer overlapping the sensing gate electrode, a sensing source electrode connected to the oxide semiconductor layer, and a sensing drain electrode spaced apart from the sensing source electrode and connected to the oxide semiconductor layer.

The organic light emitting diode display device may further include a fingerprint recognition storage storing a fingerprint information of a user.

The fingerprint recognition sensor may be on the thin film encapsulation layer.

The organic light emitting diode display device may further include a pixel defining layer between the organic light emitting diodes, the sensor vertically overlapping the pixel defining layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
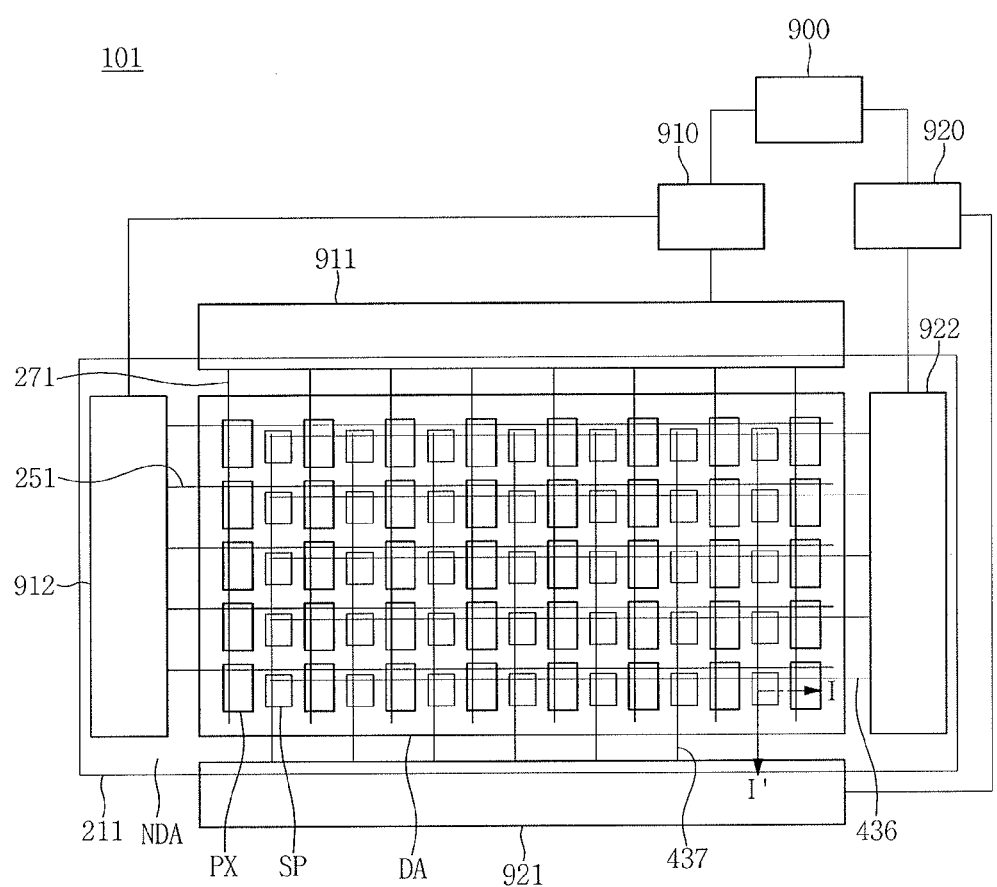
FIG. 1 illustrates a plan view of an organic light emitting diode ("OLED") display device according to a first example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a first example embodiment will be described with reference to FIGS. 1, 2, 3, and 4.

As illustrated in FIG. 1, an organic light emitting diode ("OLED") display device 101 according to the first example embodiment includes a pixel PX and a sensor SP at a display area DA. Each of a plurality of the pixels PX includes an OLED 310. Sensors SP may be disposed among the plurality of pixels PX on a plane. The sensors SP may be arranged in a selective manner. For example, the sensors SP may be disposed only at a part of the display area DA.

The OLED display device 101 may include light emission drivers 911 and 912 connected to the pixels PX to drive the pixels PX, and includes sensor drivers 921 and 922 connected to the sensors SP to drive the sensors SP. The light emission drivers may include a first light emission driver 911 applying data signals to the pixels PX, and may include a second light emission driver 912 applying gate signals to the pixels PX. The sensor drivers may include a first sensor driver 921 receiving detection signals from the sensors SP, and may include a second sensor driver 922 applying reset signals to the sensors SP. The second light emission driver 912 and the second sensor driver 922 may be disposed, for example, at a non-display area NDA of a substrate 211, as shown in to FIG. 1.

In addition, the OLED display device 101 may include a light emission control 910 configured to control the light emission drivers 911 and 912, a sensing control 920 configured to control the sensor drivers 921 and 922, and a main control 900 connected to the sensing control 920.

The light emission control 910 may control the first light emission driver 911 and the second light emission driver 912. The light emission control 910 may include an image processing circuit or the like configured to process an image.

The sensing control 920 may control the first sensor driver 921 and the second sensor driver 922, and may interpret the detection signal transmitted from the first sensor driver 921.

The main control 900 may include a central processing (CPU) configured to perform various kinds of arithmetic processing, an arithmetic circuit for image processing, a memory circuit, and the like.

In other implementations, the configurations and roles of each of the drivers 911, 912, 921, and 922 and the controls 910, 920, and 900 may be variously modified.

The sensor SP according to the first example embodiment may sense light and may operate as a touch sensor. For example, a difference in current according to a difference in an amount of light an oxide semiconductor layer has received may be detected so that whether or not a touch action is performed on a corresponding area may be identified.

An information input process and an information output process of the OLED display device 101 will be described below.

The sensor SP may convert light incident thereto into an electric signal and transmit the electric signal to the first sensor driver 921. The sensing control 920 may interpret the detection signal transmitted to the first sensor driver 921 to determine a selected position. The main control 900 may transmit a signal to the light emission control 910 based on an information, interpreted by the sensing control 920, for example, an information that a predetermined icon on the screen has been selected. The emission control 910 may transmit the signal to the light emission drivers 911 and 912, and the light emission drivers 911 and 912 may transmit an image signal to each pixel PX, which emit light according to the image signal applied thereto, thus displaying an image.

Figure 2:
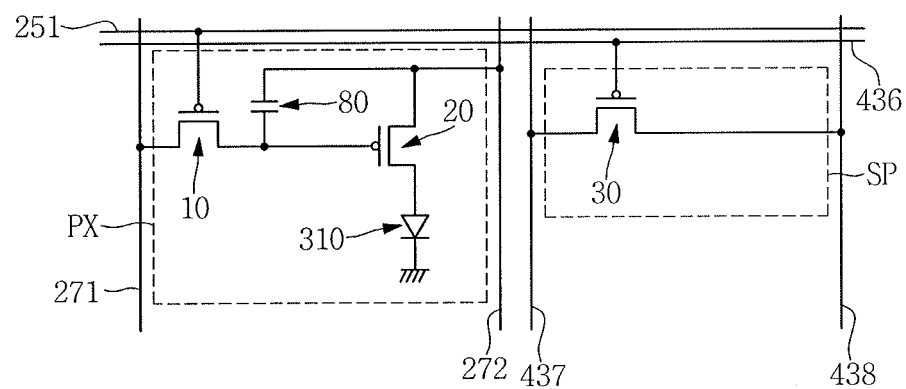
FIG. 2 illustrates a circuit diagram of a pixel and a sensor illustrated in FIG. 1.

In the present example embodiment, referring to FIG. 2, the pixel PX may include an OLED 310 and a plurality of light emission thin film transistors ("TFTs") 10 and 20, and the sensor SP may include a sensing TFT 30.

The OLED display device 101 may include a gate line 251, a data line 271, a light emission power line 272, a sensor power line 438, a reset line 436, an output line 437, and the like.

Hereinafter, the pixel PX and the sensor SP will be described in detail with reference to FIGS. 2 and 3.

According to the first example embodiment, the pixel PX has a 2Tr-1Cap structure including the OLED 310, a switching TFT 10, a driving TFT 20, and a capacitor 80. In other implementations, the pixel PX may include three or more light emission TFTs and two or more light emission capacitors.

The light emission TFTs and the light emission capacitor may constitute a compensation circuit. The compensation circuit may improve uniformity of pixels PX in respective pixel areas, which may substantially suppress deviations in image quality. In general, the compensation circuit may include two to eight TFTs.

In FIG. 2, the sensor SP includes one sensing TFT 30 but the sensor SP may include, for example, two or more sensing TFTs, and may further include a photosensor.

The sensing TFT 30 may include a sensing gate electrode 431, an oxide semiconductor layer 420, a sensing source electrode 432, and a sensing drain electrode 433, and the oxide semiconductor layer 420 may have photoelectric conversion characteristics.

In the present example embodiment, the sensing gate electrode 431 of the sensing TFT 30 is connected to the reset line 436, the sensing source electrode 432 is connected to the sensor power line 438, and the sensing drain electrode 433 is connected to the output line 437.

In an example embodiment, by a signal of the reset line 436, the sensing TFT 30 connected to the reset line 436 is selected to be turned on. In such an example embodiment, upon irradiation of light to the oxide semiconductor layer 420, a current may vary. For example, a current flowing through the oxide semiconductor layer 420 varies between cases where light is irradiated and where light is not irradiated. Based on the difference in current, whether or not the oxide semiconductor layer 420 is irradiated with light may be identified. In addition, an amount of current variation may be proportional to an intensity of light irradiated to the oxide semiconductor layer 420. Accordingly, the intensity of light may be identified based on the amount of current variation. For example, when a user touches a screen, an intensity of a light the oxide semiconductor layer 420 receives may vary. Accordingly, a difference in current according to a difference in an amount of light the oxide semiconductor layer 420 has received may be detected so that whether or not a touch action is performed on a corresponding area may be identified.

The configurations of the pixel PX and the sensor SP may be variously modified.

With the above-described configuration, the OLED display device 101 may simultaneously display and input information, using the pixel PX and the sensor SP. In addition, according to the first example embodiment, one sensing TFT 30 may constitute one sensor SP. Accordingly, the OLED display device 101 according to the first example embodiment may achieve improved performance while having a relatively simple structure.

Hereinafter, the OLED display device 101 will be described in detail with reference to FIGS. 3 and 4, focusing on a stacked structure.

Figure 3:
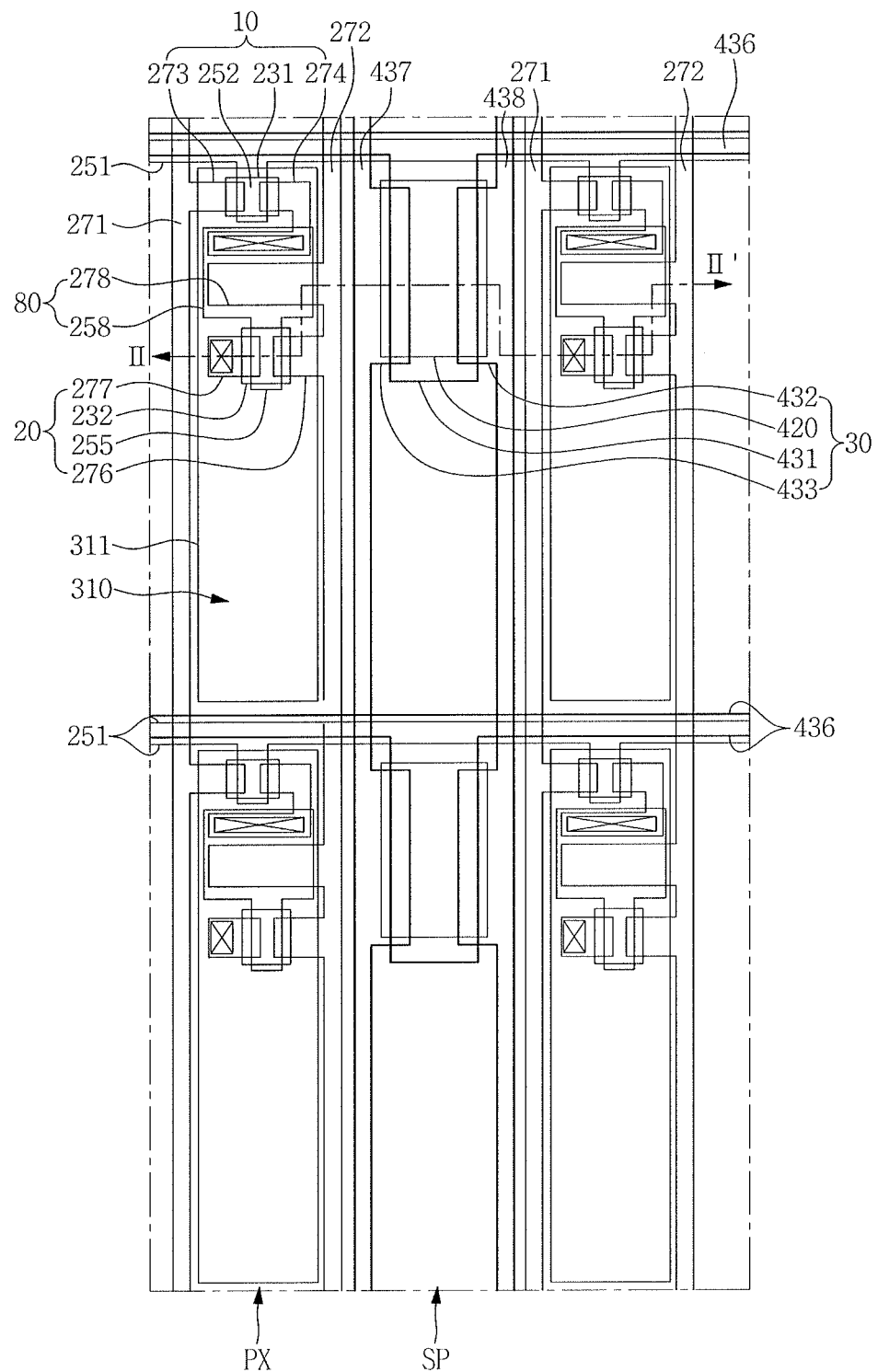
FIG. 3 illustrates a plan view of the pixel and the sensor illustrated in FIG. 1.
Figure 4:
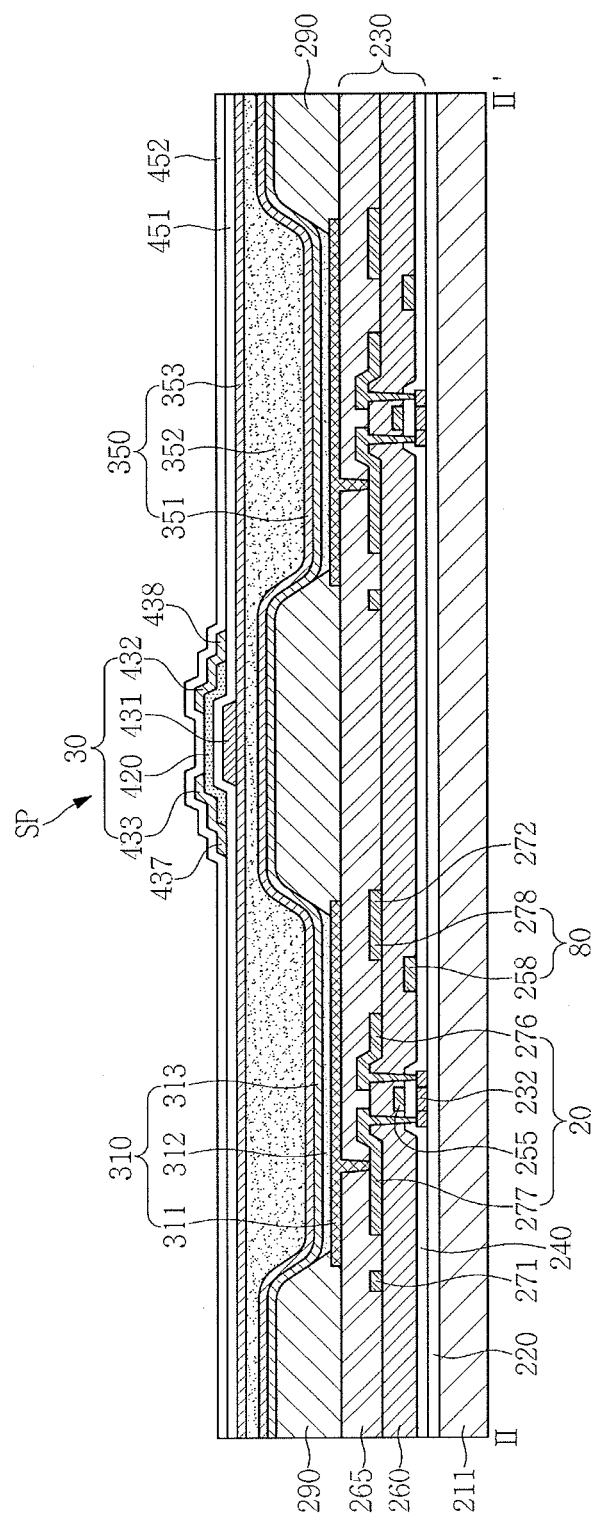
FIG. 4 illustrates a cross-sectional view taken along line II-II' of FIG. 3.

FIG. 3 is a plan view illustrating the OLED display device 101 according to the first example embodiment, and FIG. 4 is a cross-sectional view taken along line II-II' of FIG. 3.

The OLED display device 101 according to the first example embodiment may include the substrate 211, a pixel circuit 230, and the OLED 310.

The substrate 211 may include, for example, an insulating material selected from the group of glass, quartz, ceramic, plastic, and the like. In addition, the substrate 211 may include a polymer film.

A buffer layer 220 may be disposed on the substrate 211. The buffer layer 220 may include, for example, one or more layers selected from various inorganic layers and organic layers.

The pixel circuit 230 may be disposed on the buffer layer 220. The pixel circuit 230 may include a plurality of TFTs 10 and 20 and drive the OLED 310. For example, the OLED 310 may emit light according to a driving signal applied from the pixel circuit 230 to display an image.

FIGS. 3 and 4 illustrate an active matrix-type organic light emitting diode (AMOLED) display device 101 having a 2Tr-1Cap structure. For example, the 2Tr-1Cap structure may include two TFTs, e.g., a switching TFT 10 and a driving TFT 20, and one capacitor 80 in each pixel, but the OLED display device 101 may include, for example, three or more TFTs and two or more capacitors in each pixel, and may further include additional wirings. Herein, the term "pixel" refers to a smallest element for displaying an image, and the OLED display device 101 displays an image using a plurality of pixels.

Each pixel may include the switching TFT 10, the driving TFT 20, the capacitor 80, and the OLED 310. The gate line 251 extending along one direction, and the data line 271 and the light emission power line 272 insulated from and intersecting the gate line 251 may be disposed at the pixel circuit 230. Each pixel may be defined by the gate line 251, the data line 271, and the light emission power line 272 as a boundary, but the pixels may be defined by, for example, a pixel defining layer 290 or a black matrix.

The OLED 310 may include a first electrode 311, an organic light emitting layer 312 on the first electrode 311, and a second electrode 313 on the organic light emitting layer 312. The organic light emitting layer 312 may include a low molecular weight organic material or a high molecular weight organic material. Holes and electrons may be applied from the first electrode 311 and the second electrode 313, respectively, into the organic light emitting layer 312 and then combined with each other therein to form an exciton. The OLED 310 may emit light by energy generated when the exciton falls from an excited state to a ground state.

The capacitor 80 may include a pair of capacitor plates 258 and 278, and an insulating interlayer 260 interposed therebetween. In such an example embodiment, the insulating interlayer 260 may be a dielectric element. A capacitance of the capacitor 80 is determined by electric charges accumulated in the capacitor 80 and a voltage across the pair of capacitor plates 258 and 278.

The switching TFT 10 may include a switching semiconductor layer 231, a switching gate electrode 252, a switching source electrode 273, and a switching drain electrode 274. The driving TFT 20 may include a driving semiconductor layer 232, a driving gate electrode 255, a driving source electrode 276, and a driving drain electrode 277. A gate insulating layer 240 may be further provided to insulate the semiconductor layers 231 and 232 and the gate electrodes 252 and 255.

The switching TFT 10 may function as a switching element which selects a pixel to perform light emission. In the present example embodiment, the switching gate electrode 252 is connected to the gate line 251, and the switching source electrode 273 is connected to the data line 271. The switching drain electrode 274 is spaced apart from the switching source electrode 273 and connected to one of the capacitor plates, e.g., the capacitor plate 258.

In the present example embodiment, the driving TFT 20 applies a driving power, which allows the organic light emitting layer 312 of the OLED 310 in a selected pixel to emit light, to the first electrode 311 which is a pixel electrode. The driving gate electrode 255 is connected to the capacitor plate 258 that is connected to the switching drain electrode 274. Each of the driving source electrode 276 and the other of the capacitor plates, e.g., the capacitor plate 278, is connected to the light emission power line 272. The driving drain electrode 277 is connected to the first electrode 311 of the OLED 310 through a contact hole defined in a planarization layer 265.

With the above-described structure, the switching TFT 10 is operated based on a gate voltage applied to the gate line 251 and serves to transmit a data voltage applied to the data line 271 to the driving TFT 20. A voltage equivalent to a difference between a common voltage applied to the driving TFT 20 from the light emission power line 272 and the data voltage transmitted by (or from) the switching TFT 10 is stored in the capacitor 80, and a current corresponding to the voltage stored in the capacitor 80 flows to the OLED 310 through the driving TFT 20 such that the OLED 310 may emit light.

According to the first example embodiment, the first electrode 311 is an anode.

The first electrode 311 may be a transmissive electrode having light transmittance or a reflective electrode having light reflectivity. The second electrode 313 may include a semi-transmissive layer or a reflective layer.

According to the first example embodiment, the first electrode 311 is a reflective electrode, and the second electrode 313 is a semi-transmissive electrode. A light generated in the organic light emitting layer 312 may pass through the second electrode 313 to be emitted outwards.

One or more hole injection layer HIL or a hole transporting layer HTL may be disposed between the first electrode 311 and the organic light emitting layer 312, and one or more of an electron transporting layer ETL or an electron injection layer EIL may be disposed between the organic light emitting layer 312 and the second electrode 313. The organic light emitting layer 312, the hole injection layer HIL, the hole transporting layer HTL, the electron transporting layer ETL, and the electron injection layer EIL may each include an organic material, and thus may be referred to as an organic layer.

In the present example embodiment, the pixel defining layer 290 has an aperture. The aperture of the pixel defining layer 290 exposes a portion of the first electrode 311. The organic light emitting layer 312 and the second electrode 313 are sequentially stacked on the first electrode 311 at the aperture of the pixel defining layer 290. In such an example embodiment, the second electrode 213 may also be disposed on the pixel defining layer 290 as well as on the organic light emitting layer 312. In addition, the HIL, the HTL, the ETL, and the EIL may also be disposed between the pixel defining layer 290 and the second electrode 313. The OLED 310 emits light from the organic light emitting layer 312 in the aperture of the pixel defining layer 290. As such, the pixel defining layer 290 may define a light emission area.

A capping layer may be disposed on the second electrode 313 to protect the OLED 310 from the external environment.

According to the first example embodiment, a thin film encapsulation layer 350 is disposed on the OLED 310. In more detail, the thin film encapsulation layer 350 is disposed on the second electrode 313. The thin film encapsulation layer 350 may include at least one inorganic layer 351 and 353 and at least one organic layer 352 to prevent external air, such as moisture or oxygen, from permeating into the OLED 310. The thin film encapsulation layer 350 may have a structure in which at least one inorganic layer 351 and 353 and at least one organic layer 352 are alternately stacked. In FIG. 1, the thin film encapsulation layer 350 includes two inorganic layers 351 and 353 and one organic layer 352, but other numbers of layers may be used.

Each of the inorganic layers 351 and 353 may include one or more inorganic materials selected from the group of: $Al_2O_3$, $TiO_2$, $ZrO$, $SiO_2$, $AlON$, $AlN$, $SiON$, $Si_3N_4$, $ZnO$, and $Ta_2O_5$. The inorganic layers 351 and 353 may be formed through methods such as, for example, a chemical vapor deposition (CVD) method or an atomic layer deposition (ALD) method.

The organic layer 352 may include a polymer-based material. Examples of the polymer-based material may include, for example, an acrylic resin, an epoxy resin, polyimide, and polyethylene. In addition, the organic layer 352 may be formed through a thermal deposition process. The thermal deposition process for forming the organic layer 352 may be performed at a temperature range that may not damage the OLED 310.

The inorganic layers 351 and 353 which have a high density of thin film may prevent or efficiently reduce infiltration of, mostly, moisture or oxygen. Infiltration of moisture and oxygen into the OLED 310 may be largely prevented by the inorganic layers 351 and 353. Moisture and oxygen that have passed through the inorganic layers 351 and 353 may further be blocked by the organic layer 352. The organic layer 352 may have relatively low moisture-infiltration preventing effect, as compared to the inorganic layers 351 and 353. However, the organic layer 352 may also serve as a buffer layer to reduce stress among respective ones of the inorganic layers 351 and 353 and the organic layer 352, in addition to the moisture-infiltration preventing function. Further, since the organic layer 352 has planarization characteristics, an uppermost surface of the thin film encapsulation layer 350 may be planarized by the organic layer 352.

The thin film encapsulation layer 350 may have a thickness of, for example, about 10 µm or less. Accordingly, the OLED display device 101 may also have a significantly small thickness. By applying the thin film encapsulation layer 350 in such a manner, the OLED display device 101 may have flexible characteristics.

The sensing TFT 30 may be disposed on the thin film encapsulation layer 350. One sensing TFT 30 may constitute one sensor SP.

Referring to FIGS. 3 and 4, the reset line 436 and the sensing gate electrode 431 protruding from the reset line 436 are disposed on the thin film encapsulation layer 350. The reset line 436 may be disposed parallel to one of the gate line 251 and the data line 271 connected to the TFTs 10 and 20 of the OLED 310. Referring to FIG. 3, the reset line 436 is parallel to the gate line 251 of the OLED 310.

In the present example embodiment, the sensing gate electrode 431 does not overlap the first electrode 311 in order not to interfere with emission of light generated in the OLED 310. For example, the sensing gate electrode 431 is spaced apart from the first electrode 311 on a plane.

In the present example embodiment, the sensor SP is disposed among the OLEDs 310 on a plane. Referring to FIGS. 3 and 4, the pixel defining layer 290 is disposed between the first electrodes 311, and the sensor SP is disposed on the pixel defining layer 290.

According to the first example embodiment, the sensing gate electrode 431 is disposed on the pixel defining layer 290. Accordingly, the sensor SP is formed on the pixel defining layer 290 such that an aperture ratio of the OLED display device 101 is not reduced.

A first insulating layer 451 is disposed on the reset line 436 and the sensing gate electrode 431. The first insulating layer 451 has light transmittance and may be disposed over an entire surface of the thin film encapsulation layer 350.

The oxide semiconductor layer 420 is disposed on the first insulating layer 451. The oxide semiconductor layer 420 includes an oxide semiconductor. Examples of the oxide semiconductor may include, for example, oxides based on zinc (Zn), indium (In), gallium (Ga), tin (Sn), titanium (Ti), and alloys thereof. The oxide semiconductor layer 420 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

Further, the sensor power line 438 and the output line 437 are disposed on the first insulating layer 451. The sensor power line 438 may be disposed parallel to one of the gate line 251 and the data line 271 connected to the TFTs 10 and 20 of the OLED 310. Referring to FIG. 3, the sensor power line 438 is parallel to the light emission power line 272 and the output line 437 is parallel to the data line 271.

The sensor power line 438 and the output line 437 do not overlap the first electrode 311 in order not to interfere with emission of light generated in the OLED 310. For example, the sensor power line 438 and the output line 437 are spaced apart from the first electrode 311 on a plane.

The sensing source electrode 432 extending from the sensor power line 438 partially overlaps the oxide semiconductor layer 420 and the sensing drain electrode 433 extending from the output line 437 partially overlaps the oxide semiconductor layer 420. The sensing source electrode 432 and the sensing drain electrode 433 are spaced apart from each other, and a portion of the oxide semiconductor layer 420 is exposed between the sensing source electrode 432 and the sensing drain electrode 433. An external stimulus such as light is transmitted to the sensor SP through the exposed portion of the oxide semiconductor layer 420.

In addition, a second insulating layer 452 is disposed over an entire surface of the thin film encapsulation layer 350 including the sensing source electrode 432, the sensing drain electrode 433, and the exposed portion of the oxide semiconductor layer 420. The second insulating layer 452 has light transmittance.

The oxide semiconductor layer 420 may have photoreactivity. For example, the oxide semiconductor layer 420 may absorb visible light. The visible light may change electric charge mobility of the oxide semiconductor layer 420. In such an example embodiment, whether or not the sensing TFT 30 is irradiated with light may be identified by measuring a change in current flowing through the sensing TFT 30.

In an implementation, the oxide semiconductor layer 420 may have an electric charge mobility that varies depending on the wavelength of visible light.

The oxide semiconductor layer 420 may have thermal sensitivity. For example, the oxide semiconductor layer 420 may absorb infrared light, and the infrared light may change the electric charge mobility of the oxide semiconductor layer 420.

According to the first example embodiment, one sensing TFT 30 may constitute one sensor SP. Thus, the OLED display device 101 may have a relatively simple structure.

Figure 5:
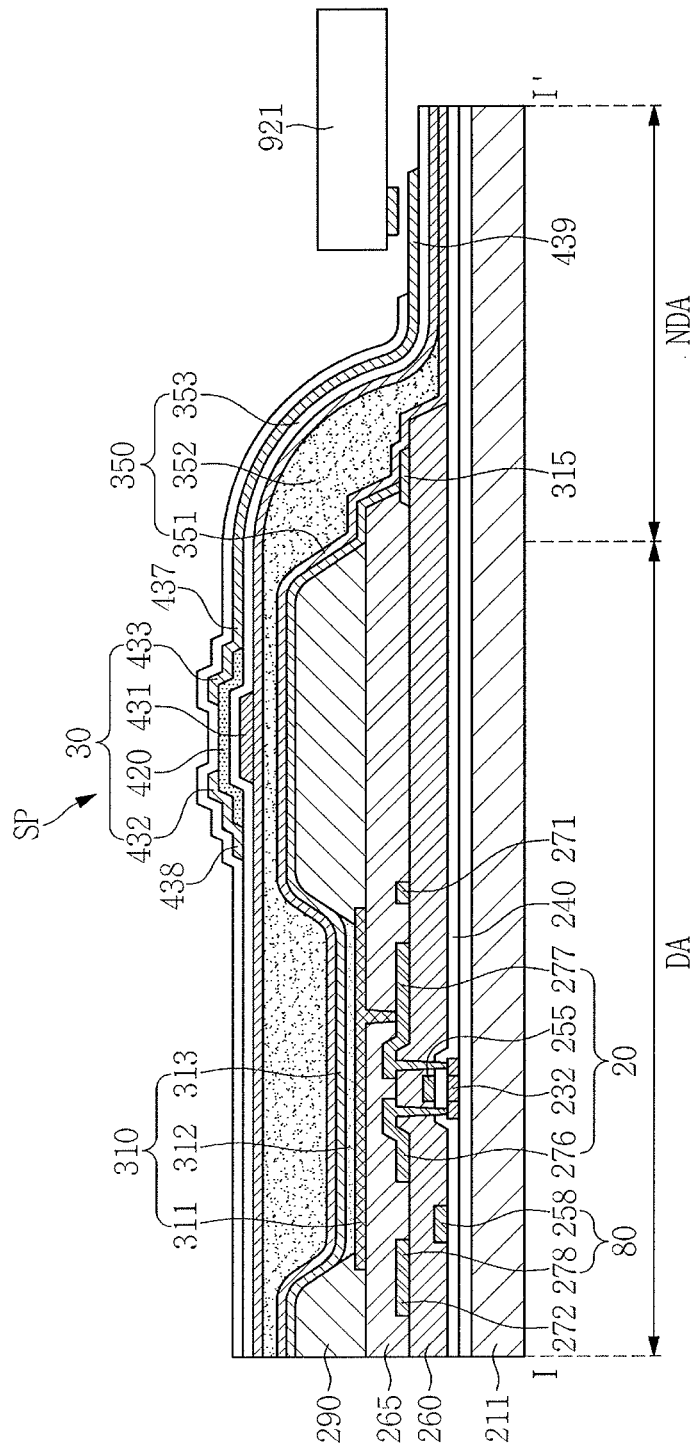
FIG. 5 illustrates a cross-sectional view taken along line I-I' of FIG. 1.

FIG. 5 is a cross-sectional view taken along line I-I' of FIG. 1.

In detail, FIG. 5 illustrates an edge of the substrate 211. Referring to FIG. 5, the second electrode 313 of the OLED 310 extends to the non-display area NDA of the substrate 211 to be connected to a common voltage wiring 315. Accordingly, a common voltage is applied to the second electrode 313.

In the present example embodiment, the thin film encapsulation layer 350 extends to the non-display area NDA to cover the second electrode 313 and the common voltage wiring 315. The organic layer 352 of the thin film encapsulation layer 350 does not extend to an end of the substrate 211 and the two inorganic layers 351 and 353 contact each other at an edge of the substrate 211. The two inorganic layers 351 and 353 contact each other, thus forming an end of the thin film encapsulation layer 350.

The output line 437 connected to the sensing drain electrode 433 is disposed on the inorganic layer 353 of the thin film encapsulation layer 350 and extends to the non-display area NDA of the substrate 211. The output line 437 is connected to an output pad 439. The output pad 439 is disposed at an end portion of the thin film encapsulation layer 350 formed by the two inorganic layers 351 and 353 in contact with each other. The output line 437 and the output pad 439 may be manufactured through substantially a same process using substantially a same material.

The output line 437 is connected to the first sensor driving 921 through the output pad 439. The first sensor driving 921 is not directly formed on the substrate 211 but may be provided in the form of a flexible printed circuit board ("FPCB") to be connected to the output pad 439 extending from the output line 437. In another implementation, the first sensor driving 921 may be formed directly on the substrate 211.

Figure 6:
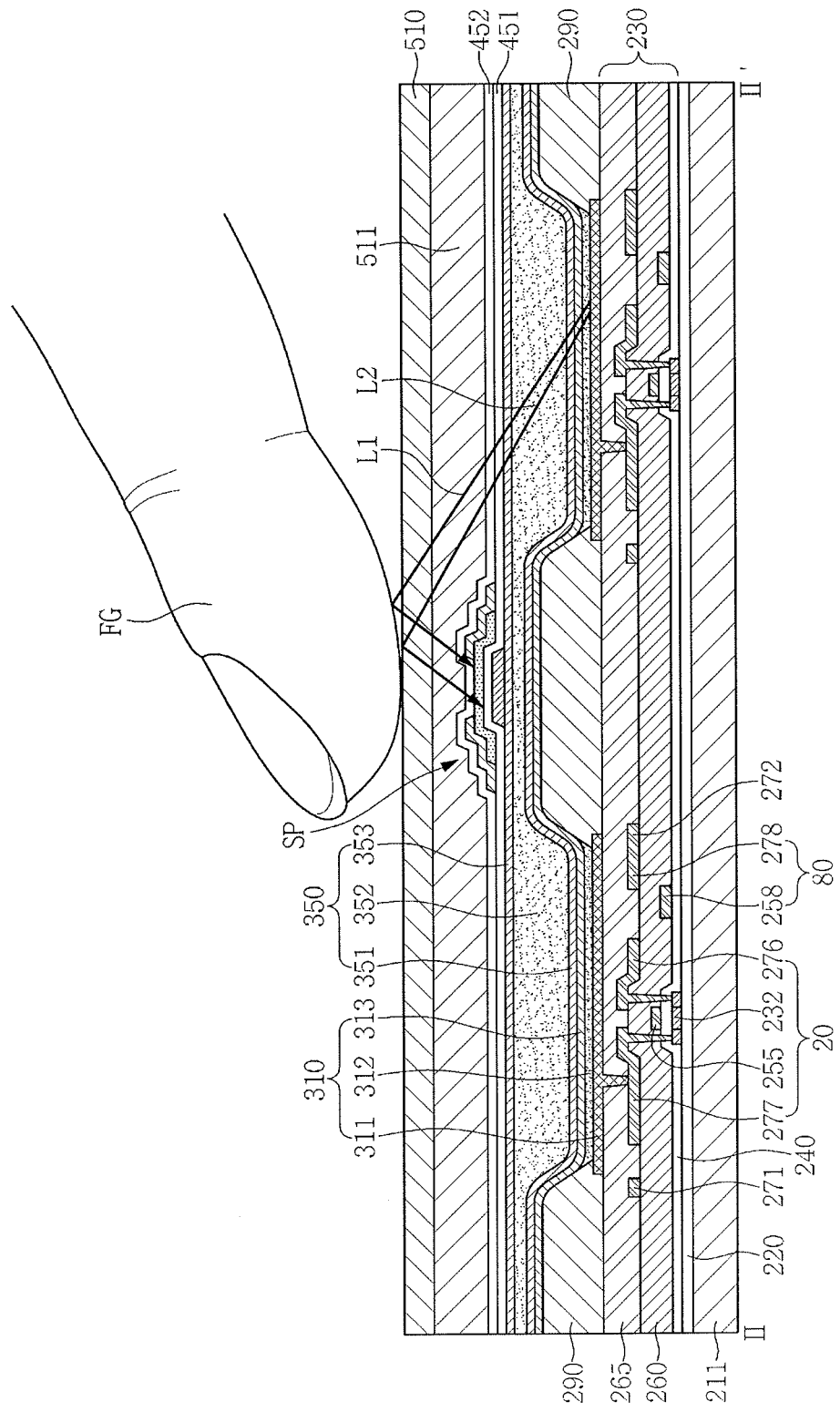
FIG. 6 illustrates a cross-sectional view illustrating a touch input.

FIG. 6 is a cross-sectional view illustrating a touch input.

The sensing TFT 30 according to the first example embodiment may serve as a touch sensor.

In the example embodiment shown in FIG. 6, the second insulating layer 452 is disposed on the sensor SP including the sensing TFT 30, a buffer layer 511 is disposed on the second insulating layer 452, and a window 511 is disposed on the buffer layer 511. The buffer layer 511 may include an adhesive. The buffer layer 511 including the adhesive may bond the window 510 and the second insulating layer 452.

As illustrated in FIG. 6, the OLED display device 101 may include the window 510. In such an example embodiment, a light generated in the OLED 310 is emitted through the window 510. Accordingly, a surface of the window 510 becomes a display surface.

In the case where a finger FG of a user contacts the window 510 or moves near the window 510, lights L1 and L2 emitted in the OLED 310 are reflected from the finger FG to reach the oxide semiconductor layer 420 of the sensing TFT 30.

Accordingly, a current flowing through the sensing TFT 30 changes, and based on this, the sensing control 920 and the main control 900 may determine that there is a touch input near the corresponding sensing TFT 30.

In more detail, after the sensing TFT 30 connected to the reset line 436 is selected and turned on by the signal of the reset line 436, in the case where the lights L1 or L2 are irradiated to the oxide semiconductor layer 420, the current may vary. Based on this difference in current, it may be identified that there is a touch input near the sensing TFT 30 including the oxide semiconductor layer 420.

Figure 7:
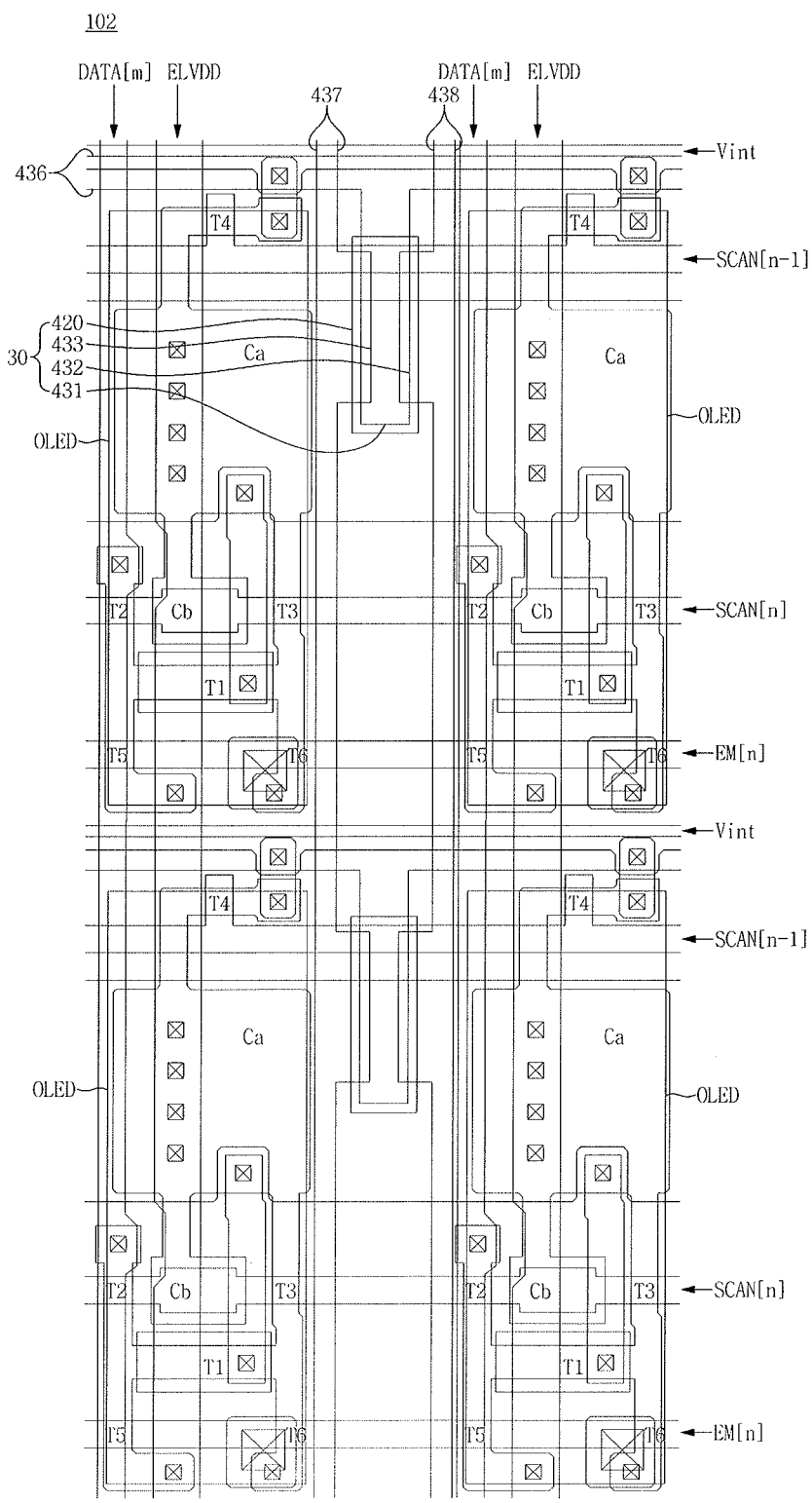
FIG. 7 illustrates a plan view of a pixel of an OLED display device according to a second example embodiment.
Figure 8:
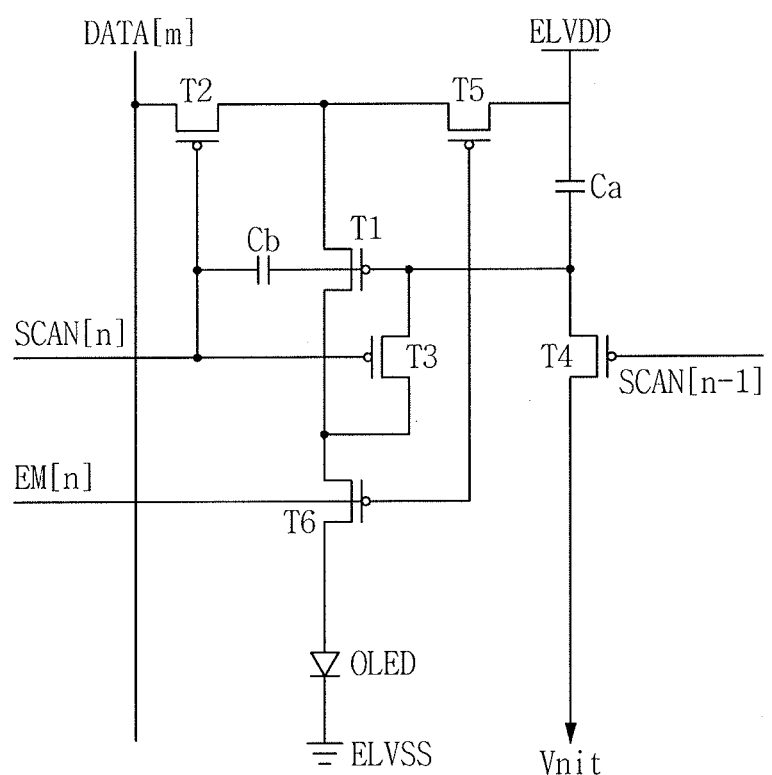
FIG. 8 illustrates a circuit diagram of one pixel in FIG. 7.

FIG. 7 is a plan view illustrating a pixel of an OLED display device 102 according to a second example embodiment, and FIG. 8 is a circuit diagram illustrating one pixel in FIG. 7.

FIG. 7 illustrates four pixels and two sensing TFTs 30 disposed among the four pixels. Each pixel illustrated in FIGS. 7 and 8 includes a driving TFT T1, a switching TFT T2, one or more capacitors Ca and Cb, a scan line SCAN[n], a data line DATA[m], a first power line ELVDD, a second power line ELVSS, and an OLED.

In addition, additional TFTs T3, T4, T5, and T6 including an additional scan line SCAN[n-1], a light emission control line EM[n], an initialization voltage wiring Vint, and a compensation TFT T3 may further be provided in the pixel. An initialization voltage transmitted through the initialization voltage wiring Vint may serve to initialize the driving TFT.

The switching TFT T2 performs a switching operation according to a scan signal transmitted through the scan line SCAN[n]. For example, a gate electrode of the switching TFT T2 is connected to the scan line SCAN[n]. A source electrode of the switching TFT T2 is connected to the data line DATA[m]. The scan line SCAN[n] and the data line DATA[m] are formed in directions intersecting each other. A drain electrode of the switching TFT T2 is electrically connected to a source electrode of the driving TFT T1 and the first power line ELVDD.

The driving TFT T1 receives a data signal based on a switching operation of the switching TFT T2 and applies a driving current to the OLED.

A gate electrode of the driving TFT T1 is connected to one electrode of a first capacitor Ca. Another electrode of the first capacitor Ca is connected to the first power line ELVDD.

The first power line ELVDD is arranged parallel to the data line DATA[m]. A drain electrode of the driving TFT T1 is electrically connected to an anode of the OLED. A cathode of the OLED is connected to the second power line ELVSS. Accordingly, the OLED receives the driving current from the driving TFT T1 to emit light.

The OLED includes the anode injecting holes, the cathode injecting electrons, and a light emitting layer between the anode and the cathode.

Referring to FIG. 7, the sensing TFT 30 includes a sensing gate electrode 431, an oxide semiconductor layer 420, a sensing source electrode 432, and a sensing drain electrode 433. In an example embodiment, the oxide semiconductor layer 420 may have photoelectric conversion characteristics. The sensing gate electrode 431 of the sensing TFT 30 is connected to a reset line 436, the sensing source electrode 432 is connected to a sensor power line 438, and the sensing drain electrode 433 is connected to an output line 437.

The reset line 436 may be disposed parallel to one of the initialization voltage wiring Vint, the scan line SCAN[n], the additional scan line SCAN[n-1], and the light emission control line EM[n]. Referring to FIG. 7, the reset line 436 is parallel to the initialization voltage wiring Vint.

In addition, each of the output line 437 and the sensor power line 438 may be parallel to one of the data line DATA[m] and the first power line ELVDD. Referring to FIG. 7, the output line 437 and the sensor power line 438 are parallel to the data line DATA[m].

Referring to FIG. 7, the sensing TFT 30 is disposed among the OLEDs on a plane, which may minimize interference with emission of light generated in the OLED.

Hereinafter, an operation of the pixel illustrated in FIG. 7 will be described in detail with reference to FIG. 8.

First, while the TFT T4 is in an on state according to a scan signal transmitted through the additional scan line SCAN[n-1], an initialization voltage is applied to one end of the first capacitor Ca and the gate electrode of the driving TFT T1.

Next, the switching TFT T2 and the compensation TFT T3 are turned on according to a scan signal transmitted through the scan line SCAN[n]. While the switching TFT T2 and the compensation TFT T3 are in an on state, a data voltage transmitted through the data line DATA [in] is transmitted to the source electrode of the driving TFT T1, and the driving TFT T1 is in diode-connection.

In such an example embodiment, a voltage subtracted from the data voltage by a threshold voltage of the driving TFT T1 is applied to the gate electrode and the source electrode of the driving TFT T1.

Next, the TFTs T5 and T6 are turned on according to a light emission control signal transmitted through the light emission control line EM[n], and by an increase of the scan signal transmitted through the scan line SCAN[n], a voltage of the gate electrode of the driving TFT T1 is boosted.

While the two TFTs T5 and T6 are in an on state, a voltage of the first power line ELVDD is applied to the source electrode of the driving TFT T1, and a driving current based on a gate-source voltage difference flows through the driving TFT T1. The driving current is transmitted to the anode of the OLED through the TFT T6 in an on state.

Figure 9:
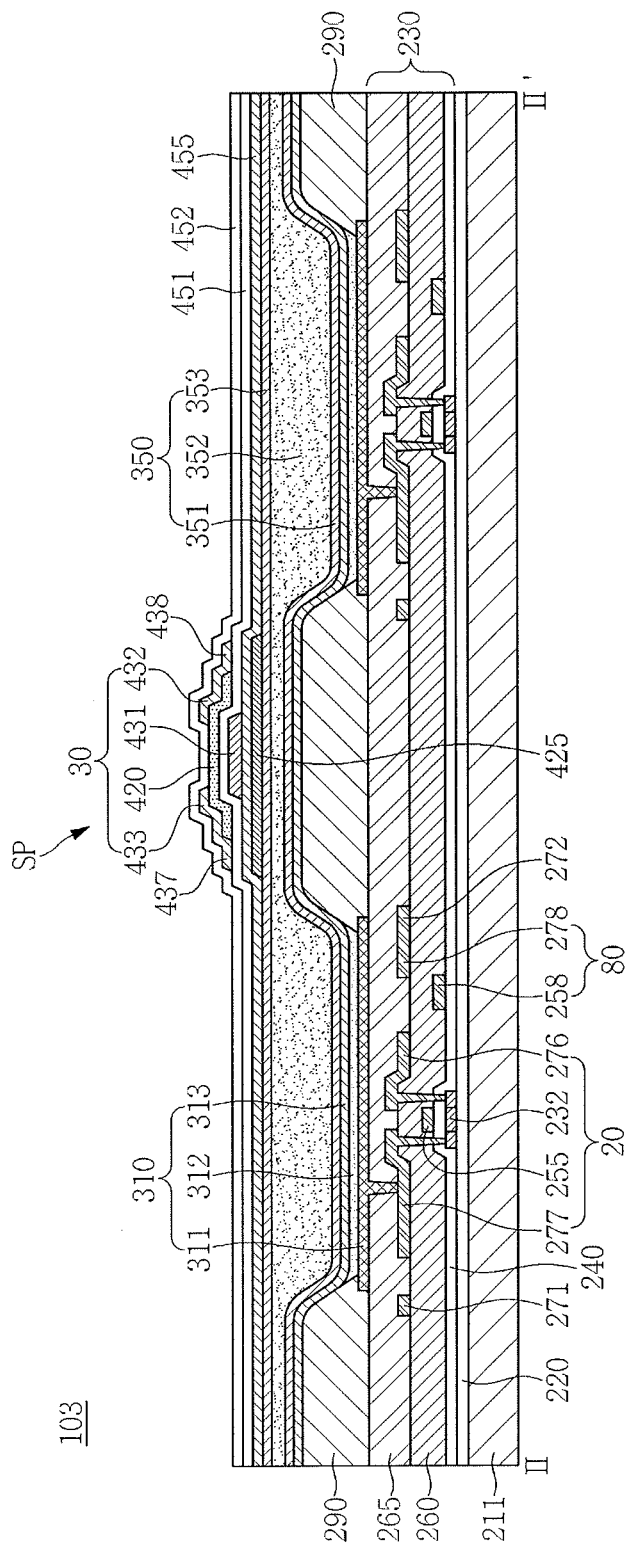
FIG. 9 illustrates a cross-sectional view of an OLED display device according to a third example embodiment.

FIG. 9 is a cross-sectional view illustrating an OLED display device 103 according to a third example embodiment.

The OLED display device 103 according to the third example embodiment includes a light blocking layer 425 between a thin film encapsulation layer 350 and a sensor SP. Referring to FIG. 9, the light blocking layer 425 is disposed on the thin film encapsulation layer 350, a passivation layer 455 is disposed on the light blocking layer 425, and a sensing TFT 30 is disposed on the passivation layer 455 to overlap the light blocking layer 425.

For example, the light blocking layer 425 is disposed between the thin film encapsulation layer 350 and a sensing gate electrode 431 of the sensing TFT 30. The light blocking layer 425 helps to prevent light generated in an OLED 310 from directly affecting an oxide semiconductor layer 420 of the sensing TFT 30.

Figure 10:
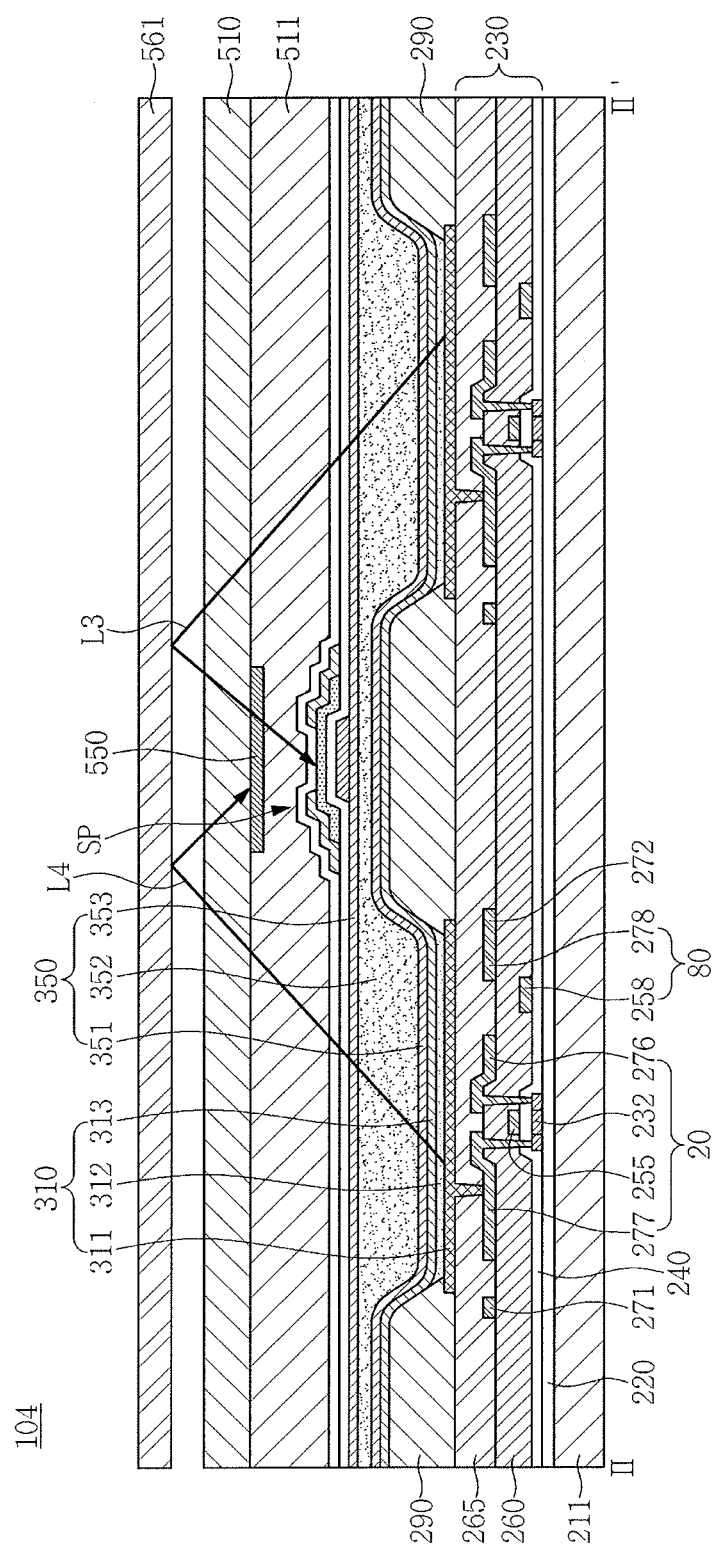
FIG. 10 illustrates a cross-sectional view of an OLED display device according to a fourth example embodiment.

FIG. 10 is a cross-sectional view illustrating an OLED display device 104 according to a fourth example embodiment.

The OLED display device 104 according to the fourth example embodiment includes a color filter 550 on a sensor SP. Referring to FIG. 9, a window 510 is disposed on the sensor SP, and the color filter 550 is disposed on the window 510. The color filter 550 overlaps the sensor SP including a sensing TFT 30.

The color filter 550 allows only light of a predetermined color to reach an oxide semiconductor layer 420 of the sensing TFT 30. Accordingly, the sensor SP may sense an intensity of the predetermined color.

Referring to FIG. 10, lights L3 and L4 emitted from an OLED 310 pass through the color filter 550 when they are incident to the oxide semiconductor layer 420 after being reflected by a reflection object 561, for example, a colored object, or a finger, stylus, etc. For example, when the color filter 550 is a red color filter, a red light L3 passes through the color filter 550 to be incident to the oxide semiconductor layer 420. On the other hand, a light L4 of a color other than the red color is absorbed by the color filter 550 and fails to reach the oxide semiconductor layer 420. Accordingly, the sensor SP may sense an intensity of the red light.

For example, in the case where a plurality of sensors SP independently capable of sensing blue, red, and green colors, respectively, are disposed on a thin film encapsulation layer 350, a color of the reflection object 561 may be identified based on integrated analysis on color intensity information obtained from each sensor SP. In the case where these sensors SP are arranged at high density, an image of the reflection object 561 may be recognized by the sensor SP.

Figure 11:
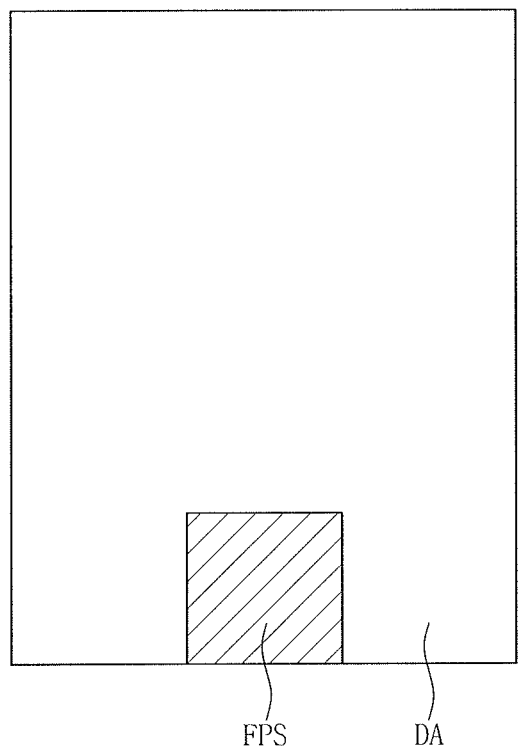
FIG. 11 illustrates a plan view of an OLED display device according to a fifth example embodiment.

FIG. 11 is a plan view illustrating an OLED display device 105 according to a fifth example embodiment.

The OLED display device 105 according to the fifth example embodiment has a display area DA and a fingerprint recognition sensor FPS at a portion of the display area DA.

The fingerprint recognition sensor FPS may be disposed at a portion of a thin film encapsulation layer 350 and may include a plurality of sensors SP. The sensor SP arranged for fingerprint recognition may be referred to as a fingerprint recognition sensor.

For fingerprint recognition, a main control 900 may include a fingerprint recognition storage. In addition, the sensor SP may be connected to the fingerprint recognition storage.

In addition, a fingerprint information of a predetermined user may be stored in the fingerprint recognition storage. Accordingly, whether or not a fingerprint recognized using the fingerprint recognition sensor FPS matches the fingerprint of the predetermined user may be verified. In the case where the fingerprint recognized using the fingerprint recognition sensor FPS matches the fingerprint of the predetermined user, the OLED display device 105 may be unlocked, for example.

By way of summation and review, display devices may be made to receive input of information by contact with, for example, a finger or a stylus pen and a screen. Such display devices having an information input function may be used for, for example, a mobile phone, a personal digital assistant ("PDA"), a portable game machine, a car navigation system, an automated teller machine ("ATM"), and the like. A display device having an information input function may be manufactured by, for example, separately manufacturing a touch panel and combining it with a display panel, or by forming various sensors directly in the display panel.

As described above, embodiments relate to an OLED display device having an information display function and an information input function.

In one or more example embodiments, the OLED display device has a simple structure while having both an information display function and an information input function.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic light emitting diode display device, comprising:
   a substrate;
   a plurality of organic light emitting diodes on the substrate;
   a thin film encapsulation layer on the organic light emitting diodes; and
   at least one sensor on the thin film encapsulation layer, the sensor including:
   a sensing gate electrode;
   an oxide semiconductor layer overlapping the sensing gate electrode;
   a sensing source electrode connected to the oxide semiconductor layer; and
   a sensing drain electrode spaced apart from the sensing source electrode and connected to the oxide semiconductor layer.

2. The organic light emitting diode display device as claimed in claim 1, wherein the sensor is between adjacent organic light emitting diodes.

3. The organic light emitting diode display device as claimed in claim 1, wherein each organic light emitting diode of the plurality of organic light emitting diodes includes:
   a first electrode;
   an organic light emitting layer on the first electrode; and
   a second electrode on the organic light emitting layer,
   wherein the sensing gate electrode is spaced apart from the first electrode in a lateral direction.

4. The organic light emitting diode display device as claimed in claim 3, further comprising a pixel defining layer between the first electrodes, the sensor vertically overlapping the pixel defining layer.

5. The organic light emitting diode display device as claimed in claim 1, wherein the oxide semiconductor layer includes at least one of: zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

6. The organic light emitting diode display device as claimed in claim 1, wherein the oxide semiconductor layer has photoreactivity.

7. The organic light emitting diode display device as claimed in claim 1, wherein the oxide semiconductor layer absorbs a visible light.

8. The organic light emitting diode display device as claimed in claim 7, wherein the visible light changes an electric charge mobility of the oxide semiconductor layer.

9. The organic light emitting diode display device as claimed in claim 7, wherein the oxide semiconductor layer has an electric charge mobility varying according to a wavelength of the visible light.

10. The organic light emitting diode display device as claimed in claim 1, wherein the oxide semiconductor layer has thermal sensitivity.

11. The organic light emitting diode display device as claimed in claim 1, wherein the oxide semiconductor layer absorbs an infrared light, and the infrared light changes an electric charge mobility of the oxide semiconductor layer.

12. The organic light emitting diode display device as claimed in claim 1, wherein the organic light emitting diode is connected to a thin film transistor,
the thin film transistor is connected to a gate line on the substrate and a data line on the substrate, the data line intersecting the gate line,
the sensing gate electrode is connected to a reset line parallel to one of the gate line and the data line, and
the sensing source electrode is connected to a sensor power line parallel to another of the gate line and the data line.

13. The organic light emitting diode display device as claimed in claim 12, wherein the sensing drain electrode is connected to an output line parallel to one of the gate line and the data line.

14. The organic light emitting diode display device as claimed in claim 1, further comprising a light blocking layer between the thin film encapsulation layer and the sensor.

15. The organic light emitting diode display device as claimed in claim 1, further comprising a color filter on the sensor.

16. The organic light emitting diode display device as claimed in claim 1, wherein the sensor is a fingerprint recognition sensor.

17. The organic light emitting diode display device as claimed in claim 1, wherein the thin film encapsulation layer includes a laminate of inorganic and organic layers, the inorganic and organic layers being interposed between the oxide semiconductor layer and an upper electrode of the organic light emitting diode.

18. An organic light emitting diode device, comprising;
a substrate;
a plurality of organic light emitting diodes on the substrate;
a thin film encapsulation layer on the organic light emitting diodes; and
a fingerprint recognition sensor on the thin film encapsulation layer, the fingerprint recognition sensor including at least one sensor that includes:
a sensing gate electrode;
an oxide semiconductor layer overlapping the sensing gate electrode;
a sensing source electrode connected to the oxide semiconductor layer; and
a sensing drain electrode spaced apart from the sensing source electrode and connected to the oxide semiconductor layer.

19. The organic light emitting diode display device as claimed in claim 18, further comprising a fingerprint recognition storage storing a fingerprint information of a user.

20. The organic light emitting diode display device as claimed in claim 18, further comprising a pixel defining layer between the organic light emitting diodes, the sensor vertically overlapping the pixel defining layer.

* * * * *